(12) United States Patent
Himmer

(10) Patent No.: US 10,475,982 B2
(45) Date of Patent: Nov. 12, 2019

(54) THERMOELECTRIC MODULE

(71) Applicant: Mahle International GmbH, Stuttgart (DE)

(72) Inventor: Thomas Himmer, Reichenbach (DE)

(73) Assignee: Mahle International GmbH (DE)

(*) Notice: Subject to any disclaimer, the term of this patent is extended or adjusted under 35 U.S.C. 154(b) by 200 days.

(21) Appl. No.: 15/489,687

(22) Filed: Apr. 17, 2017

(65) Prior Publication Data

US 2017/0301850 A1 Oct. 19, 2017

(30) Foreign Application Priority Data

Apr. 18, 2016 (DE) .......................... 10 2016 206 507
May 11, 2016 (DE) .......................... 10 2016 208 070

(51) Int. Cl.
*H01L 35/28* (2006.01)
*H01L 35/32* (2006.01)

(52) U.S. Cl.
CPC .................................. *H01L 35/32* (2013.01)

(58) Field of Classification Search
CPC ..................................................... H01L 35/32
See application file for complete search history.

(56) References Cited

U.S. PATENT DOCUMENTS

| | | | |
|---|---|---|---|
| 3,377,206 A * | 4/1968 | Hanlein | ................... H01L 35/06 136/212 |
| 2010/0170554 A1 | 7/2010 | Hiroyama | |
| 2012/0060886 A1 | 3/2012 | Determan et al. | |
| 2014/0261607 A1 | 9/2014 | Zhang et al. | |
| 2015/0034138 A1 | 2/2015 | Himmer | |

FOREIGN PATENT DOCUMENTS

| | | |
|---|---|---|
| DE | 102009048985 A1 | 4/2011 |
| DE | 102013214988 A1 | 2/2015 |
| EP | 2159854 A1 | 3/2010 |

OTHER PUBLICATIONS

German Search report for DE102016206507.6, dated Apr. 5, 2017.
English abstract for DE-102009048985.

* cited by examiner

*Primary Examiner* — Angelo Trivisonno
(74) *Attorney, Agent, or Firm* — Fishman Stewart PLLC

(57) ABSTRACT

A thermoelectric module may include a plurality of thermoelectric elements arranged spaced apart from one another between a hot-side substrate and a cold-side substrate. A plurality of conductor bridges may electrically interconnect the plurality of thermoelectric elements. An electrically insulated holder may position the plurality of thermoelectric elements between the hot-side substrate and the cold-side substrate. The holder may include a separate through-opening for each of the plurality of thermoelectric elements. One or more of the plurality of conductor bridges may rest loosely on the hot-side substrate and/or the cold-side substrate.

23 Claims, 9 Drawing Sheets

THERMOELECTRIC MODULE

CROSS-REFERENCE TO RELATED APPLICATIONS

This application claims priority to German Patent Application No. 10 2016 208 070.9 filed May 11, 2016 and German Patent Application No. 10 2016 206 507.6 filed Apr. 18, 2016, the contents of which are hereby incorporated by reference in their entirety.

TECHNICAL FIELD

The present invention relates to a thermoelectric module.

BACKGROUND

A generic thermoelectric module is known for example from DE 10 2013 214 988 A1 or from EP 2 159 854 A1. Such a module comprises a plurality of thermoelectric elements which are arranged spaced apart from one another between a hot side of the module and a cold side of the module. Furthermore, a plurality of conductor bridges are provided for electrical interconnection of the thermoelectric elements as well as for contacting with electrical connections of the module. A hot-side substrate forming the hot side consists of an electrically insulating material or has an electrical insulation on an inner side facing the thermoelectric elements. Similarly to this, a cold-side substrate forms the cold side and consists of an electrically insulating material or has an electrical insulation on an inner side facing the thermoelectric elements. In the thermoelectric module known from EP 2 159 854 A1, an electrically insulating holder is additionally known for positioning the thermoelectric elements between the substrates wherein the holder for each thermoelectric element comprises a separate through opening into which the respective thermoelectric element is inserted.

Thermoelectric elements consist of thermoelectric semiconductor materials which convert a temperature difference into a potential difference, i.e. into an electrical voltage, and conversely. In this way, a heat flow can be converted into an electrical current and conversely. Thermoelectric modules are based on the Peltier effect when they convert electrical energy into heat and on the Seeback effect when they convert heat into electrical energy. Inside a thermoelectric module, p-doped and n-doped thermoelectric elements are interconnected. Usually a plurality of such thermoelectric modules are interconnected to form a thermoelectric generator which can be used for cooling or heating depending on the energization or can generate an electrical current from a temperature difference combined with a corresponding heat flow.

For example, these thermoelectric modules or thermoelectric generators can be used in internal combustion engines, in particular in motor vehicles, for recovering waste heat, for example, in order to convert waste heat contained in the exhaust gas into electrical energy. Problems with such applications are the temperatures which vary within a large temperature range combined with the requirement that the most efficient possible heat transfer within the thermoelectric module is desired between the thermoelectric elements and the substrates whereas at the same time, an electrical insulation must be provided at this point. Materials which are good thermal conductors usually have a poor electrical insulation. Furthermore, materials which are thermally good insulators usually have a poor electrical conductivity. Furthermore, the varying temperatures result in thermally induced expansion effects which give rise to relative movements of the individual components within the thermoelectric module. Such relative movements can increase the mechanical loading of the thermoelectric module. These thermomechanical loadings adversely affect the lifetime of such a thermoelectric module. The thermomechanical loadings occur on the one hand between the thermoelectric elements and the conductor bridges and on the other hand between the conductor bridges and the substrates. Furthermore, these thermomechanical loadings also occur between electrical contacts and the associated conductor bridges.

SUMMARY

The present invention is concerned with the problem of providing an improved or at least a different embodiment for a thermoelectric module of the previously described type which is characterized by a reduced thermomechanical loading.

This problem is solved according to the invention in particular by the features of the independent claim(s). Advantageous embodiments are the subject matter of the dependent claims. Further solutions and further advantageous embodiments are also found in the following description.

According to a first aspect, the present invention is based on the idea of fitting the conductor bridges each with a bridge body which is configured to be thermally and electrically conducting as well as elastically deformable. The thermoelectric elements assigned to the respective conductor bridge can be electrically interconnected by the electrical conductivity of this bridge body. As a result of the thermal conductivity of the bridge body, the heat flow between the thermoelectric elements assigned to the conductor bridge and the appurtenant substrate can be improved. The elastic deformability of the bridge body can compensate for thermally induced relative movements between the thermoelectric elements and the substrates and thus reduce the thermomechanical loadings. Since the thermomechanical loadings within the bridge body can consequently be largely compensated, the bridge body and therefore the conductor bridge fitted therewith brings about a thermomechanical decoupling between the appurtenant thermoelectric elements and the appurtenant substrate. In this respect, the lifetime of the thermoelectric module can be improved.

Conductor bridges fitted with such a bridge body can be arranged between the thermoelectric elements and the hot-side substrate. Likewise. conductor bridges fitted with such a bridge body can be arranged between the thermoelectric elements and the cold-side substrate. Preferably all the conductor bridges assigned to the hot-side substrate and/or all the conductor bridges assigned to the cold-side substrate are each fitted with such a bridge body.

According to an advantageous embodiment, the respective conductor bridge can have a metallic conducting body on its inner side facing the thermoelectric elements which is arranged outside the bridge body between the two thermoelectric elements which are electrically interconnected by this conductor bridge. It has been shown that with the aid of such a conducting body, the electrical resistance of the bridge body can be significantly reduced. Accordingly, the electrical conductivity of the conductor bridge is improved, which improves the energy efficiency of the thermoelectric module.

According to a further development, the respective conducting body can be electrically connected to the bridge body which improves the previously described effect.

Furthermore, the respective conducting body can be arranged at a distance from the two thermoelectric elements which are electrically interconnected by the respective conductor bridge. The respective conducting body thus does not bring about any short circuit for bypassing the bridge body and therefore does not bring about any direct electrical connection between the affected thermoelectric elements. On the contrary, only the electrical conductivity of the bridge body is improved by the conductor body.

Additionally or alternatively the respective conducting body can only extend between the two thermoelectric elements along the bridge body. Consequently the respective conducting body is comparatively small and accordingly inexpensive. Preferably the respective conducting body can extend over the entire width of the bridge body, wherein the conducting body additionally extends transversely to the longitudinal direction of the bridge body.

According to another advantageous embodiment, the respective bridge body can be formed by graphite film. Graphite film is characterized by a comparatively good electrical conductivity on the one hand and by a comparatively good thermal conductivity on the other hand. However a particular advantage of graphite film is its elastic deformability.

Alternatively to this, the respective bridge body can be formed by a porous metal structure. Metals are usually good electrical and thermal conductors. As a result of the porosity of the metal structure, its elastic deformability is significantly increased. Examples for porous metal structures are, for example, metal mesh, metal cushion, metal fabric, metal foam, metal textile or wire mesh as well as any combinations of at least two such structures. Consequently, a bridge body which has a comparatively high thermal and electrical conductivity and in addition is elastically deformable to a comparatively high degree can be provided comparatively simply and cheaply.

In an advantageous embodiment, the respective conductor bridge comprising the bridge body can rest loosely on the respective substrate. In other words, in this embodiment a firm connection between conductor bridge and substrate is dispensed with. This measure facilitates relative movements between the conductor bridge and the respective substrate and reduces the risk of thermally induced mechanical stresses.

According to a further development, the respective bridge body can rest directly loosely on the respective substrate. In this case, the bridge body can rest on the inner side of the substrate or on the electrical insulation optionally provided there which pertains to the circumference of the substrate.

In another embodiment, the respective bridge body can have a metal coating on an inner side facing the thermoelectric elements which is mechanically connected fixedly, in particular in a firmly bonded manner, to the two thermoelectric elements connected electrically by the respective conductor bridge. As a result of the metal coating, together with the fixed mechanical connection, the electrical contact between the associated thermoelectric elements can be improved.

Alternatively to this, it is also possible to provide at least one of the substrates with a metal layer on its inner side, wherein the respective bridge body has a metal coating on an outer side facing the respective substrate which is mechanically connected fixedly, in particular in a firmly bonded manner, to the metal layer of the respective substrate. Such a fixed connection improves the heat transfer between conductor bridge and substrate.

In another embodiment, the respective conductor bridge can comprise a metal bridge on an inner side of the bridge body facing the thermoelectric elements, which is arranged between the bridge body and the end faces facing the substrate of the two thermoelectric elements interconnected electrically by the conductor bridge. In such an embodiment, the electrical conductor function of the conductor bridge is largely fulfilled by the metal bridge whereas the bridge body still fulfils the function of thermomechanical decoupling. In this case, the bridge body itself need not necessarily be electrically conductive.

In a further development. the respective metal bridge can be mechanically connected fixedly, in particular in a firmly bonded manner, with the end faces of the two thermoelectric elements. This fixed connection on the one hand improves the heat transfer and on the other hand also the electrical contact.

In another embodiment, the respective metal bridge can be supported on the respective end face by means of at least one further thermally and electrically conducting as well as elastically deformable bridge body. In this respect, a sandwich structure is proposed here in which the metal bridge is arranged between at least two bridge bodies. In principle, a common further bridge body can be provided which extends from one thermoelectric element to the other thermoelectric element. Alternatively to this, two separate further bridge bodies can be provided, so that the one further bridge body is assigned to the one thermoelectric element whereas the other further bridge body is assigned to the other thermoelectric element. Expediently a gap which is configured through to the metal bridge extends between these two further bridge bodies.

According to a further development, the at least one further bridge body can rest loosely on the respect thermoelectric element or have a metal coating and be mechanically connected fixedly, in particular in a firmly bonded manner, with the respective end face. Additionally or alternatively the at least one further bridge body can rest loosely on the metal bridge or can have a metal coating and be mechanically connected fixedly, in particular in a firmly bonded manner, to the metal bridge.

Furthermore the actual bridge body can rest loosely on the metal bridge or have a metal coating and be connected fixedly, in particular in a firmly bonded manner, to the metal bridge.

A second aspect of the present invention starts from a thermoelectric module which is fitted with a holder for positioning the thermoelectric elements between the substrates. This holder is configured to be electrically insulated; for example, it is produced from at least one electrically insulating material such as, for example, plastic or ceramic. This holder can be particularly advantageously used with the aforesaid bridge bodies which enable a thermomechanical decoupling between the respective conductor bridge and the respective substrate, that the holder positions the thermoelectric elements relative to one another.

According to a first sub-aspect of this second aspect, it is now proposed to rest the conductor bridges proximal to the hot-side substrate, i.e. the conductor bridges assigned to the hot-side substrate loosely on the hot-side substrate. Additionally or alternatively it is proposed to rest the conductor bridges proximal to the cold-side substrate, i.e. the conductor bridges assigned to the cold-side substrate loosely on the cold-side substrate. The loose resting of the conductor bridges on the appurtenant substrate enables relative movements between the conductor bridges and the respective substrate, with the result that thermally induced stresses between conductor bridges and substrate are reduced. Combined with the holder, a desired relative position between the thermoelectric elements can still be ensured so that the thermoelectric elements can be displaced as it were as a cohesive block relative to the respective substrate.

According to a second sub-aspect of the second aspect, which can be implemented additionally or alternatively to the previously described first sub-aspect, it is proposed to provide the holder with a hot region facing the hot-side substrate made of a first material and with a cold region facing the cold-side substrate made of a second material different from the first material. As a result, the holder is not a homogeneous component made of a single material but a hybrid component which has at least two regions of different materials. As a result, the holder can be optimized with regard to the thermal loads which occur inside the thermoelectric module. For example, the first material of the hot region located proximal to the hot side of the module has a higher thermal strength than the second material of the cold region which is located proximal to the cold side of the module. In particular the temperature range in which such a thermoelectric module can be used can thereby be increased towards higher temperatures.

In particular, according to a further development, it can be provided that the hot region is made of ceramic whilst the cold region is made of plastic. The ceramic hot region thereby acquires a very high thermal resistance whereas the cold region made of plastic reduces the manufacturing costs of the holder.

In another further development, the holder can comprise a first holder part which forms the holding region and a second holder part which forms the cold region, which are attached to one another. The two holder parts are therefore manufactured separately and then assembled in order to form the holder. Alternatively it is also feasible to first manufacture the holder part in order to then manufacture the other holder part by integral casting or overmoulding.

In another further development it can be provided that the through-openings for insertion of the thermoelectric elements are only formed on the hot region or only on the cold region. This measure also reduces the manufacturing costs for the holder. The respective other region can, for example, be configured as a frame which embraces the thermoelectric elements.

According to a third sub-aspect of the second aspect, which can be implemented additionally or alternatively to the aforesaid sub-aspects, it is proposed that for the conductor bridges proximal to the hot-side substrate and/or for the conductor bridges proximal to the cold-side substrate the holder has recesses in which the conductor bridges are inserted so that a recessed arrangement is obtained for the conductor bridges in the holder. Thus, not only a positioning of the thermoelectric elements but also a positioning of the conductor bridges is accomplished by the holder. This simplifies the manufacture and handling of a unit comprising holder, thermoelectric elements and conductor bridge.

In principle, the recesses can be dimensioned so that the conductor bridges can only be partially inserted therein. Consequently, the holder has a distance from the hot-side substrate and/or from the cold-side substrate. The distance reduces interactions between the holder and the substrate. In particular, the heat conduction through the holder is thereby reduced and concentrated on the thermoelectric elements instead.

Alternatively it is also possible to arrange the conductor bridges depressed so far into the recesses that they end flush with an outer side of the holder facing the respective substrate. Consequently the respective outer side of the holder rests directly on the facing substrate. This measure can simplify the assembly of the module and gives the module an increased stability.

According to a fourth sub-aspect of the second aspect, which can be implemented additionally or alternatively to the aforesaid sub-aspects, it is proposed that the holder has a hot part proximal to the hot-side substrate and a cold part proximal to the cold-side substrate, wherein the through openings are formed both in the hot part and in the cold part. This measure improves the positioning function of the holder.

According to a further development, the hot part can be fastened on the hot-side substrate whilst the cold part is arranged adjustably relative to the hot part along the thermoelectric elements. Alternatively it can also be provided that the cold part is fastened to the cold-side substrate whilst the hot part is arranged adjustably relative to the cold part along the thermoelectric elements. In other words, according to this embodiment, one holder part is fastened to the appurtenant substrate whilst the other holder part is adjustable relative to the substrates along the thermoelectric elements. This design has assembly advantages. For example, a comparatively large distance between the holder parts can be set for pre-assembly in order to be able to reliably position the inserted thermoelectric elements relative to one another. After fixing the one holder part on the appurtenant substrate, this distance between the holder parts can be reduced so that after mounting the other substrate, the holder has a (greater) distance with respect to this.

According to a further development, it can be provided that the hot part and the cold part are arranged adjustably on one another via a guide. Alternatively it can be provided that the holder part the hot part and the cold part are fastened to one another via an articulated and/or elastic connection which allows the relative adjustment. Likewise, a rigid connection can be provided which contains a predetermined break point in order to enable a relative adjustment when the connection is broken. These measures also facilitate the assembly of the module.

In another embodiment, an intermediate space can be formed in the region of the thermoelectric elements between the hot part and the cold part, in which hot part and cold part are spaced apart from one another. As a result, the holder has a comparatively small volume which reduces the use of material and therefore manufacturing costs. The heat conduction between the substrates through the holder is also reduced and instead concentrated on the thermoelectric elements.

According to a fifth sub-aspect of the second aspect, which can be implemented additionally or alternatively to the aforesaid sub-aspects, it is proposed that the holder has a positioning region having through openings which is supported on at least one of the substrates via holding regions. It is further provided that this positioning region has a greater distance from the hot-side substrate than from the cold-side substrate. In this way, the thermal loading of the positioning region and therefore the holder is significantly reduced.

According to a further development, the respective holding region can be clipped or screwed or pinned or adhesively bonded to the respective substrate. As a result of the different temperatures, different fastening techniques can be used on the hot-side substrate on the one hand and on the cold-side substrate on the other hand. For example, the respective holding region is clipped or screwed to the hot-side substrate whilst it is pinned or adhesively bonded to the cold-side substrate.

According to a sixth sub-aspect of the second aspect which can be implemented additionally or alternatively to the previously described sub-aspects, it is provided that at least one conductor bridge is fixed by means of a holding element on the holder. This results in an improved positioning the conductor bridges relative to the holder. Combined with a loose contact between the conductor bridges and the respective substrate, a cohesive unit of holder, thermoelectric elements and conductor bridges can thus be formed which as a whole is mounted in a floating manner relative to the respective substrate. Expediently a plurality of, preferably all, the conductor bridges are firmly connected to the holder by means of such holding elements. This design is particularly advantageous when the conductor bridges are only loosely in contact with the thermoelectric elements.

In an advantageous further development, it can be provided that the holding element has a holding element base from which at least one holding element shaft emanates which passes through a conductor bridge opening formed in the respective conductor bridge and penetrates into the holder, wherein the holding element base is supported on an outer side of the respective conductor bridge facing away from the holder. This results in a particularly advantageous efficient positive fixing of the respective conductor bridge on the holders.

According to a further development, the respective conductor bridge can have a recess on its outer side in which the holding element base of the respective holding element is arranged in a recessed manner. Thus, contact of the holding element with the respective substrate can be avoided, in the same way as an associated risk of damage during relative movements.

Another further development provides that the respective holding element is configured as nails or as staples or as clips. By this means the respective holding element can be implemented particularly inexpensively and can be mounted easily and in an automated manner.

According to a seventh sub-aspect of the second aspect which can be implemented additionally or alternatively to the previously described sub-aspects, it is provided that at least one fixing element is arranged fixedly on the hot-side substrate and/or on the cold-side substrate by means of which the holder is fastened on the respective substrate. By this means the holder can be fixed particularly easily on the respective substrate. By means of the holder fixed on the respective substrate, the thermoelectric elements positioned therewith and optionally the conductor bridges fixed thereon are then positioned relative to the respective substrate.

In a further development, it can be provided that the respective fixing element comprises a fixing mandrel projecting from the respective substrate which penetrates into the holder. This design operates reliably.

An improvement now provides that the respective fixing element has at least one fixing barb on its fixing mandrel which engages with the holder. This results in easy assembly with reliable fixing.

Particularly advantageous is a further development in which the respective fixing element is formed integrally on the substrate and in which the respective fixing element is cut freely and exposed on the respective substrate configured as metal sheet. This simplifies the integral configuration of the fixing elements on the respective substrate. For example, there is no separate fastening of the fixing elements on the substrate. In addition, the exposed fixing elements can be series-produced by a stamping and bending process.

According to a third aspect of the present invention which can be implemented additionally or alternatively to the aforesaid first aspect and/or to the aforesaid second aspect, it is proposed that at least one such electrical connection of the module is fitted with a contact element which rests on such a conductor bridge pre-tensioned by means of a pre-tensioning device. Whereas usually a firmly bonded connection between a contact element of the electrical connection and the respective conductor bridge is preferred, a pre-tensioned resting also makes it possible to dispense with a firmly bonded connection and consequently also makes it possible to use materials for the conductor bridge in which a firmly bonded connection is not possible or not readily possible. The desired pre-tensioned resting on the contact element on the respective conductor bridge can be achieved with the aid of the pre-tensioning device. By this means a satisfactory electrical contact is achieved which can also react elastically to thermally induced relative movements. The pre-tensioning is in this case expediently oriented parallel to a distance direction between the substrates. Consequently the contact element rests on an inner side of the conductor bridge which faces away from that substrate to which this conductor bridge is assigned and on which this conductor bridge rests for its part. Thus, the conductor bridge, the contact element and the appurtenant substrate form a sandwich structure in which the respective substrate and the contact element lie on the outside whilst the conductor bridge is arranged on the inside.

An embodiment is advantageous in which the pre-tensioning device pre-tensions the contact element in the direction of the one substrate with respect to the respective conductor bridge and is thereby supported on the other substrate. The pre-tensioning force of the pre-tensioning device represents an action which according to the basic principles of physics requires a corresponding reaction, namely an oppositely oriented supporting force. According to this proposal, this supporting force is accordingly supported on the opposite substrate. Thus, a closed force path is formed inside the thermoelectric module.

In an advantageous further development, the pre-tensioning device can be supported parallel to a distance direction of the substrates in alignment with the contact element on the other substrate. As a result, the pre-tensioning device has an extremely compact structure.

In another further development, the pre-tensioning device can have a support element which is supported on the other substrate. This improves the force transmission between the pre-tensioning device and the other substrate.

In a further development, this support element can be guided longitudinally displaceably on the contact element. Support element and contact element are therefore positioned with respect to one another, which improves the generation of the pre-tensioning force.

Support element and contact element can be placed inside one another to form a telescopic guidance. This achieves a particularly efficient longitudinal guidance between the elements of the pre-tensioning device with mutual centering.

Advantageously the pre-tensioning device can have a spring element which is supported on the one hand on the support element and on the other hand on the contact element. Thus, the spring element is located between substrates and therefore inside the module. The pre-tensioning device thus acquires a particularly compact design.

Advantageously, it can now be provided that the spring element is arranged centrally to a connecting line which extends parallel to the distance direction of the substrates and which leads directly from a contact point by means of which the contact element rests on the respective conductor bridge to a support point via which the support element is supported on the respective substrate. This also brings about an extremely compact design for the pre-tensioning device.

Particularly expedient is a further development in which the spring element is arranged in a telescopic guide. This embodiment is also characterized by an extremely compact design.

Alternatively to this, the pre-tensioning device can have a contact lever comprising the contact element and a support lever comprising the support element which are mounted pivotably on one another about a pivot axis running perpendicular to the distance direction of the substrates. Fitting the pre-tensioning device with these levers makes it possible to guide the levers out of the region of the substrates and therefore out of an interior of the module. Usually, more installation space is available outside the module, for example, in order to generate the pre-tensioning force.

According to an advantageous further development, the pre-tensioning device can comprise a spring element which is supported pre-tensioned on the contact lever and on the support lever on a side of the pivot axis facing away from the contact element and from the support element. This spring element is therefore expediently located outside the substrate and in particular outside an interior of the module. As a result, in particular a larger and/or stronger spring element can be used.

In another further development, the contact lever or the support lever can preferably have a connection point for connecting an electrical cable at an end remote from the contact element and from the support element. With the aid of the lever, this connection point can also be located outside the substrate or outside an interior of the module, which simplifies the assembly of the module.

Whereas the contact element and optionally the contact lever are made from an electrically conducting material, e.g. metal, the support element and optionally the support lever can be made of an electrically insulating material, e.g. plastic.

According to an advantageous further development, the support element can have a projecting pin on an outer side facing away from the one substrate, which engages in a pin receptacle formed on the other substrate. A secure positional fixing for the support element on the other substrate is hereby achieved.

The contact element can be fitted with a contact contour on an outer side facing the conductor bridge which has a plurality of linear and/or punctuate contact zones for contact with the conductor bridge. For example, the contact contour can have a plurality of webs tapering towards the conductor bridge and/or a plurality of tapering, pyramid-like or conical projections. As a result of the pre-tensioning force the contact contour can penetrate more or less deeply into the conductor bridge according to the material of the conductor bridge. This can considerably improve the electrical contact.

Regardless of whether this involves the first, second or third aspect of the invention, the module can have a housing which contains a hermetically sealed interior in which the thermoelectric elements are arranged. As a result, the thermoelectric elements in the interior are protected from harmful environmental influences, for example, from impurities and moisture.

The interior can be evacuated or filled with a protective gas. Alternatively to this, regardless of whether this involves the first, second or third aspect of the invention, it is again fundamentally possible that the hot-side substrate is a part of a wall of a heating channel for guiding a heating fluid wherein additionally or alternatively it can be provided that the cold-side substrate is a part of a wall of a cooling channel for guiding a cooling fluid. By integrating the respective substrate in the wall of such a channel, the heat transfer between the substrate and the respective fluid is improved since the respective fluid makes direct contact with the respective substrate.

Likewise, regardless of the respective aspect of the present invention and of the appurtenant embodiments and combinations thereof, the respective hot-side substrate and/or the respective cold-side substrate can consist of an electrically insulating material or have an electrical insulation on an inner side facing the thermoelectric elements.

In all said aspects the respective thermoelectric module is expediently configured as a flat plate-shaped body. Accordingly, the substrates are also plate-shaped bodies which each extend in one plane. Alternatively to this it is fundamentally possible to configure such a thermoelectric module as cylindrical or cylinder-segment-shaped so that the substrates have corresponding curved shapes.

Further important features and advantages of the invention are obtained from the subclaims, from the drawings and from the relevant description of the figures with reference to the drawings.

It is understood that the features mentioned previously and to be explained further hereinafter can be used not only in the respectively given combination but also in other combinations or alone without departing from the scope of the present invention. The present disclosure therefore in particular covers all the combinations which can be obtained by arbitrary combination of the three said aspects and sub-aspects thereof and embodiments and further developments thereof.

Preferred exemplary embodiments of the invention are presented in the drawings and are explained in detail in the following description, where the same reference numbers relate to the same or similar or functionally the same components.

DETAILED DESCRIPTION

Figure 1:
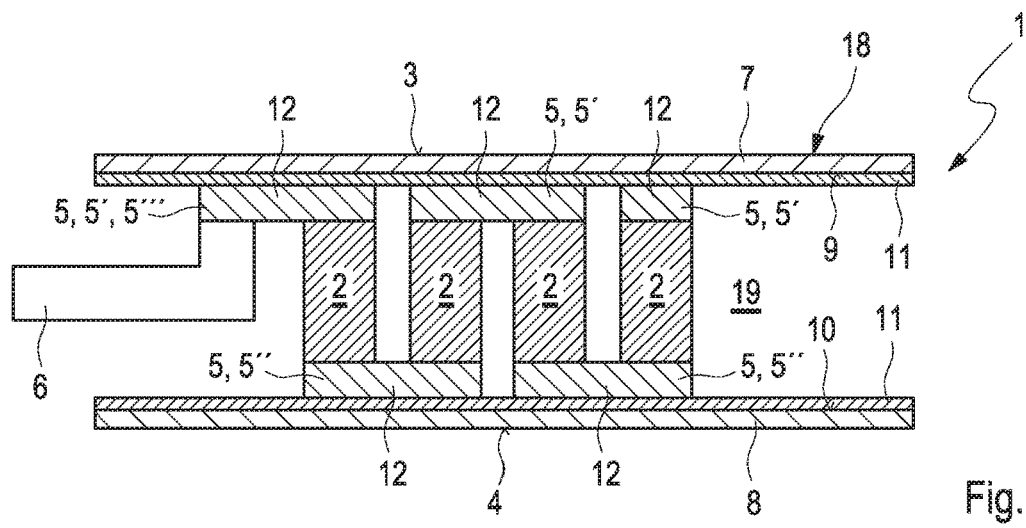
FIGS. 1 to 19 each show a highly simplified sectional view of a thermoelectric module in different embodiments.

The various embodiments described hereinafter with reference to FIGS. 1 to 24 can in principle be combined arbitrarily with one another insofar as this is appropriate. Furthermore, the embodiments belong to three fundamental aspects of the invention which can also be combined arbitrarily with one another insofar as this is appropriate. The second of these aspects has a plurality of sub-aspects which can also be combined arbitrarily with one another insofar as this is appropriate.

According to FIGS. 1 to 24, a thermoelectric module 1 comprises a plurality of thermoelectric elements 2. In the diagrams of FIGS. 1 to 19, 21 and 23 precisely four such thermoelectric elements 2 can be identified; in FIGS. 22 and 24 sixteen thermoelectric elements 2 can be identified. It is clear that such a module 1 can in principle have arbitrarily many such thermoelectric elements 2 which are preferably arranged at least two-dimensionally, i.e. not only adjacent to one another as can be seen in FIGS. 1 to 19, 21 and 23 but also consecutively as can be seen in FIGS. 22 and 24. The thermoelectric elements 2 are arranged spaced apart from one another between a hot side 3 of the module 1 and a cold side 4 of the module 1. Furthermore, the module 1 comprises a plurality of conductor bridges 5 which are used for electrical interconnection of the thermoelectric elements 2 and for connection of electrical connections 6 of which at least two are provided per module 1 but of which however only one in each case is shown in FIGS. 1 and 16 to 19, only the view according to FIG. 20 shows two such connections 6. The conductor bridges 5 assigned to or facing the hot side 3 can hereinafter also be designated with 5'. The conductor bridges 5 assigned to or facing the cold side 4 can hereinafter also be designated by 5". The conductor bridges 5 provided for connection of an electrical connection 6 can hereinafter also be designated by 5'''.

Figure 2:
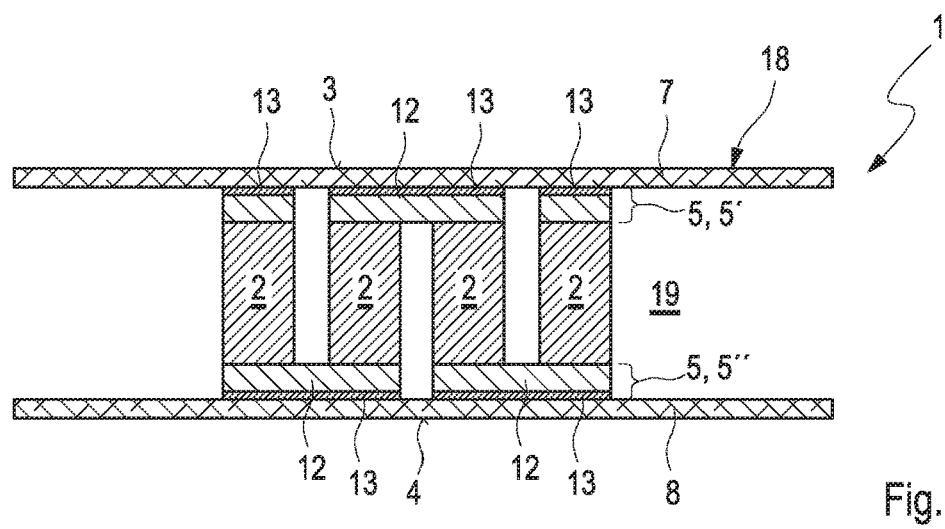

The hot side 3 is formed by a hot-side substrate 7. The cold side 4 is formed by a cold-side substrate 8. In the example of FIG. 2 the two substrates 7, 8 are each formed from an electrically insulating material such as, for example, from a ceramic. In all the other embodiments, the substrates 7, 8 are preferably made of an electrically conducting material, preferably of a metal, in particular stainless steel, and provided with an electrical insulation 11 on the inner side thereof 9 or 10 facing the thermoelectric elements 2, which forms a part of the respective substrate 7, 8.

The conductor bridges 5 can in principle be made of any electrically and thermally conducting material. According to a first aspect of the present invention, at least the conductor bridges 5 assigned to one of the substrates 7, 8 each have a bridge body 12 which is configured to be thermally and electrically conducting and elastically deformable. Expediently, both the conductor bridges 5' assigned to the hot side 13 and also the conductor bridges 5" assigned to the cold side 4 are each provided with such a bridge body 12.

According to FIG. 1, the bridge bodies 12 can rest directly on the respective substrate 7, 8, in particular on the insulation 11 thereof. In the example of FIG. 2, the bridge bodies 12 are each supported via a metal coating 13 on the respective substrate 7, 8. The metal coating 13 can in this case be formed on the respective bridge body 12 or on the respective substrate 7, 8.

Figure 3:
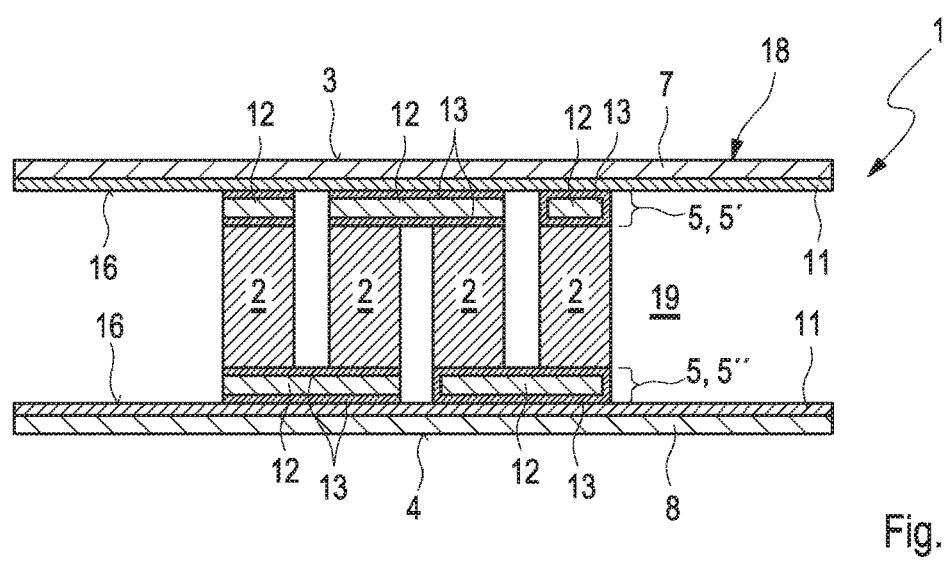

In the example of FIG. 3, the respective conductor bridge 5 has a metal coating 13 in each case on the appurtenant bridge body 12 both on an outer side facing the respective substrate 7, 8 and also on an inner side facing the respective thermoelectric element 2. Furthermore, in the two bridge bodies 12 arranged on the right in FIG. 3 it is indicated that the respective metal layer 13 can be configured to be circumferential so that ultimately the entire surface of the bridge body 12 is formed by the metal layer 13.

Figure 4:
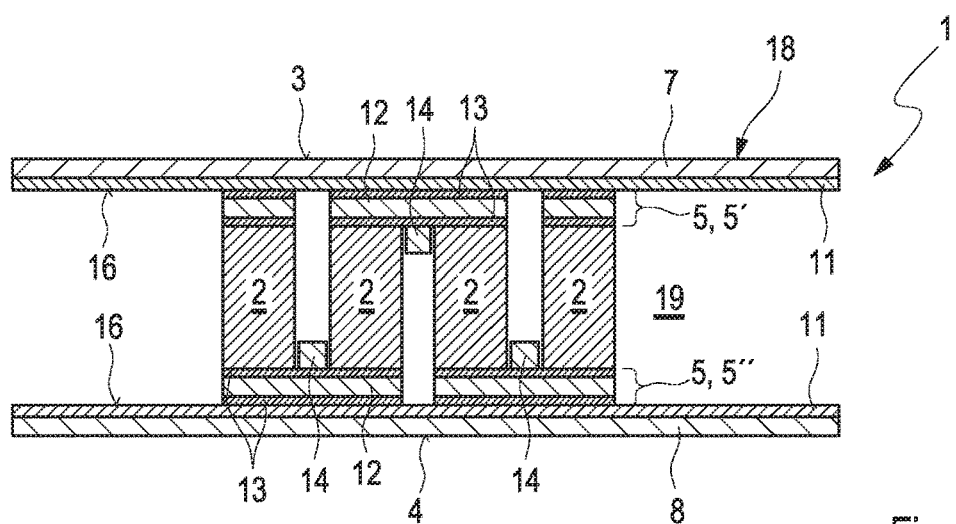

According to FIG. 4, the respective conductor bridge 5 can have a metallic conducting body 14 on the inner side thereof facing the thermoelectric elements 2. The conducting body 14, for example, a wire piece which expediently has a rectangular cross-section here is in this case arranged outside the bridge body 12 between the two thermoelectric elements 2 which are electrically interconnected by the respective conductor bridge 5. The respective conducting body 14 is electrically connected to the respective bridge body 12. In the example of FIG. 4 this is accomplished by contact of the conducting body 14 with the metal layer 13. In particular, the conducting body 14 can be connected, preferably in a firmly bonded manner, to the metal layer 13. A soldered connection is primarily feasible. In the example of FIG. 4, the respective conducting body 14 is spaced apart from the two thermoelectric elements 2 which are electrically interconnected by the respective conductor bridge 5. Corresponding gaps or voids which are not designated in detail can be identified in FIG. 4. Expediently the respective conducting body 14 only extends between these two thermoelectric elements 2 which are electrically interconnected by the appurtenant conductor bridge 5, along the appurtenant bridge body 12. Preferably the respective conducting body 14 in this case only extends over the entire width of the bridge body 12 and is thereby oriented transversely to the longitudinal direction of the bridge body 12. In the sectional views shown here the rectilinear conducting bodies 14 extend with their longitudinal direction perpendicular to the plane of the drawing. The longitudinal direction of the appurtenant bridge body 12 lies in the plane of the drawing.

The bridge body 12 is expediently formed by a graphite film which can be the case, for example, in the embodiments of FIGS. 1 to 6 and 8 to 18. Purely as an example, an embodiment is indicated in FIG. 7 in which the respective bridge body 12 is formed by a porous metal structure 15. It is clear that in principle, the bridge body 12 can also be formed by such a metal structure 15 in the other embodiments. The porous metal structure 15 is in this case expediently formed by a member from the group metal mesh, metal cushion, metal fabric, wire mesh, metal foam, metal textile or any arbitrary combination of two or more members of this group.

If the respective bridge body 12 according to FIGS. 3 and 4 has the metal coating 13 on its inner side facing the thermoelectric elements 2, the bridge body 12 can be firmly connected, preferably in a firmly bonded manner, to the respective thermoelectric elements 2.

Regardless of whether such a metal coating 13 is provided or not, according to another embodiment it can be provided that the respective conductor bridge 5 provided with the bridge body 12 and in the extreme case formed by the bridge body 12 rests loosely on the respective substrate 7, 8. In particular, the respective bridge body 12 can rest directly loosely on the respective substrate 7, 8. Such direct contact is shown in FIG. 1. There the bridge body 12 certainly rests on the respective insulation 11 but this forms a part of the respective substrate 7, 8.

If on the other hand, a firm fixing between the respective conductor bridge 5 and the respective substrate 7, 8 is desired, this can be implemented for example by the metal coating 13 on the bridge body 12 which for this purpose is formed at least one the outer side of the bridge body 12 facing the respective substrate 7, 8. Expediently the insulation 11 of the respective substrate 7, 8 can then also be metallized or provided with a metal layer which is indicated purely as an example only in FIGS. 3 to 7 and designated by 16. Thus, a firmly bonded connection, preferably a soldered connection can also be achieved here. The same applies to the embodiment shown in FIG. 7 in which the porous metal structure 15 can be firmly connected directly to the metal layer 16 of the insulation 11.

Figure 5:
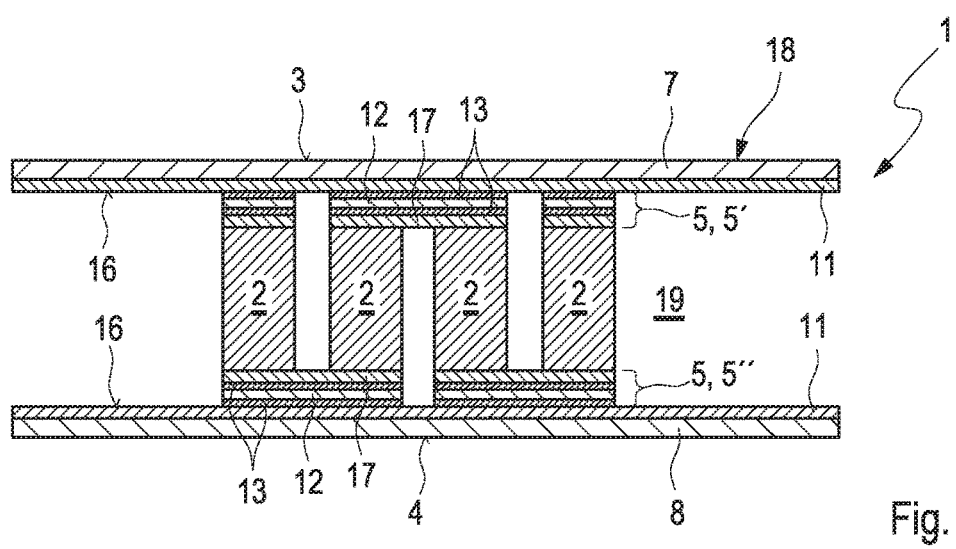
Figure 6:
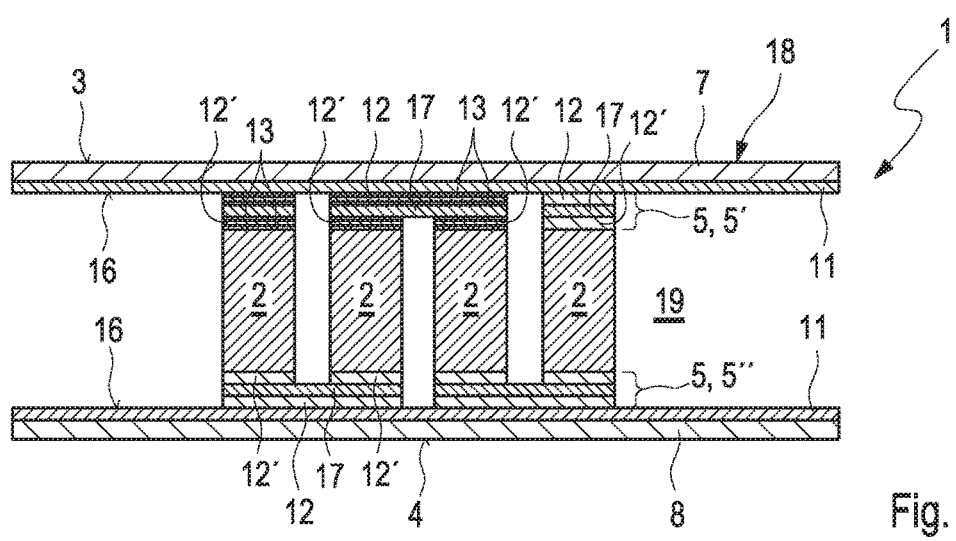
Figure 7:
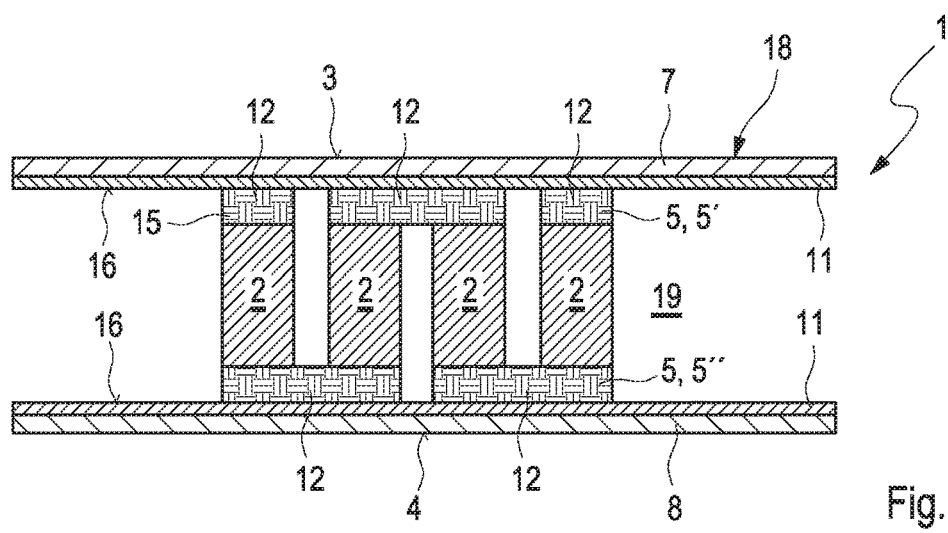
Figure 8:
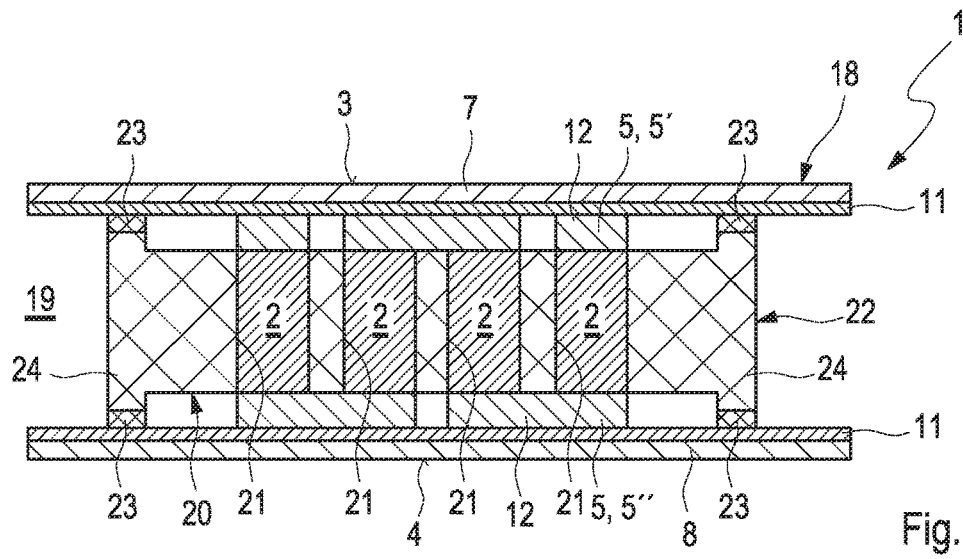

In the examples in FIGS. 5 and 6, the respective conductor bridge 5 is additionally provided with a metal bridge 17 which is provided additionally to the bridge body 12 and is located on an inner side of the respective bridge body 12 facing the thermoelectric elements 2. The metal bridge 17 expediently extends over the entire length of the appurtenant bridge body 12 and is therefore ultimately arranged between the bridge body 12 and axial end faces of the two thermoelectric elements 2 to which the respective bridge body 12 or the respective conductor bridge 5 is assigned. The said end faces of the thermoelectric elements 2 are facing the respective substrate 7, 8. In the example in FIG. 5 the respective metal bridge 17 which obviously consists of a metal material, is directly in contact with the end faces of the two thermoelectric elements 2. Expediently a firm, preferably firmly bonded connection is preferred here.

In contrast, FIG. 6 shows an embodiment in which the respective metal bridge 17 is supported on the respective end face via at least one further bridge body 12' which is also configured to be thermally and electrically conducting as well as elastically deformable. In the example of FIG. 6, two separate further bridge bodies 12' are provided per metal bridge. In principle, however a joint continuous further bridge body 12' is feasible. In FIG. 6 it is provided at the conductor bridges 5" which are assigned to the cold-side substrate 8 that the bridge body 12 rests directly on the cold-side substrate 8 and directly on the metal bridge 17. In addition, it is provided there that the further bridge bodies 12' on the one hand rest directly on the thermoelectric elements 2 and on the other hand directly on the metal bridge 17. Depending on the material of the bridge body 12 or of the further bridge body 12', a loose resting or a preferably firmly bonded fixing comes into consideration. In FIG. 6 it is provided at the three left thermoelectric elements 2 that the conductor bridges 5' assigned to the hot-side substrate 7' are further configured so that the appurtenant bridge body 12 and also the further bridge bodies 12 are each provided with the metal coating 13 on the outer side thereof facing the hot-side substrate 7 and with the metal coating 13 on the inner side thereof facing the cold-side substrate 8. Thus, in particular an embodiment is possible in which the bridge body 12 is fastened on the hot-side substrate via the metal coating 13 and the further metal layer 16 optionally provided on the insulation 11. Furthermore, these bridge bodies 12 are also fastened on the metal bridge 12 via the metal coating 13. The further bridge bodies 12' are in this case fastened on the one hand on the respective thermoelectric element 2 and on the other hand on the respective metal bridge 17 in each case via the metal coating 13.

Expediently the module 1 additionally has a housing 18 which is shown only partially in FIGS. 1 to 19, 21 and 23 and which contains an interior 19 which is hermetically sealed towards the outside. The thermoelectric elements 2 are arranged in this interior 19. Expediently two walls of the housing 19 facing away from one another or remote from one another are formed by the substrates 7, 8. In an alternative design, the hot-side substrate 7 can form a part of a wall of a heating channel in which a heating fluid is guided. Additionally or alternatively the cold-side substrate 8 can form a part of a wall of a cooling channel in which a coolant is guided. By this means the modules 1 can be integrated particularly easily into a heat exchanger.

According to FIGS. 8 to 15 and 21 to 24, according to a second aspect of the present invention, the module 1 additionally has an electrically insulating holder 20 which is used for positioning the thermoelectric elements 2 between the substrates 7, 8. Such a holder 20 can in principle be provided in all the embodiments shown here. If a housing 18 is provided, the holder 20 is arranged in the interior 19. The holder 20 has a separate through-opening 21 for each thermoelectric element 2, into which the respective thermoelectric element 2 is inserted. Expediently an inner cross-section of the respective through-opening 21 is matched to an outer cross-section of the respective thermoelectric element 2 so that a secure positional fixing is established for the respective thermoelectric element 2 in the through-opening 21 on the holder 20.

Such a holder 20 can, for example be used when the conductor bridges 5' proximal to the hot-side substrate 7 rest loosely on the hot-side substrate 7 or on its insulation 11 and/or when the conductor bridges 5" proximal to the cold-side substrate 7 rest loosely on the cold-side substrate 8 or on its insulation 11. This corresponds to a first sub-aspect of this second aspect of the invention. In particular a block designated by 22 in FIG. 8 can thus be created which is mounted as it were in a floating manner between the substrates 7, 8. Alternatively to this, the holder 20 itself can be firmly connected by means of suitable connection points 23 to the hot-side substrate 7 and/or the cold-side substrate 8. For example, the holder 20 is only fastened to the respective substrate 7, 8 in a circumferential region 24 which borders the thermoelectric elements in the circumferential direction.

Figure 9:
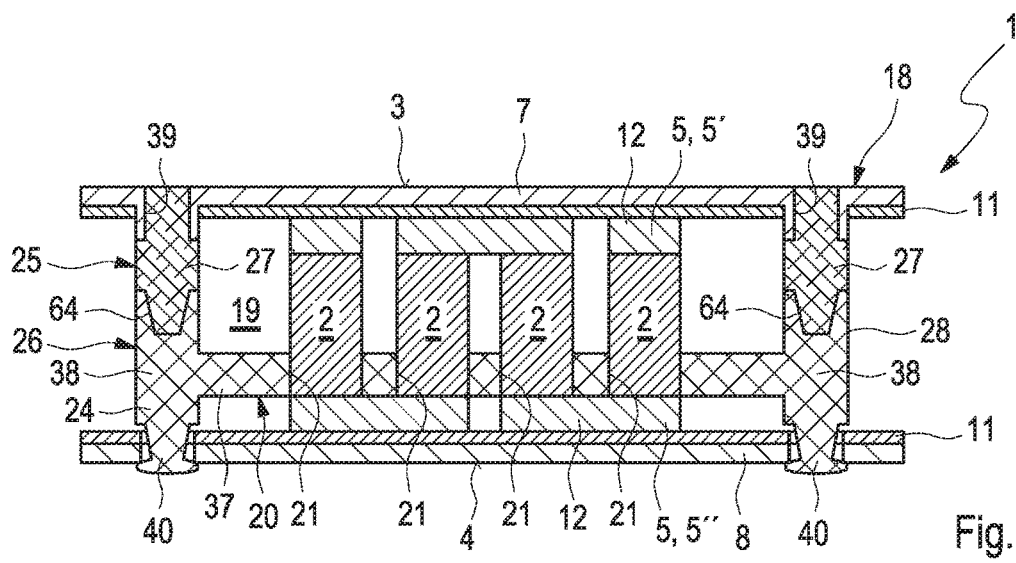

FIG. 9 shows a second sub-aspect of this second aspect of the invention. For this it is provided that the holder 20 has a hot region 25 facing the hot-side substrate 7 and a cold region 26 facing the cold-side substrate 8 which are made from different materials. Accordingly, the hot region 25 is made from a first material which can, for example, comprise a ceramic. In contrast to this, the cold region 26 is made of a second material which differs from the first material and which can, for example, comprise a plastic. In the example of FIG. 9 the hot region 25 is formed by at least one first holder part 27 whilst the cold region 26 is formed by at least one second holder part 28. The different holder parts 27, 28 are attached to one another. In the example of FIG. 9 a plug connection 64 is formed between the two holder parts 27, 28 which has conical or wedge-shaped protrusions on the first holder part 27 and has complementary conical or wedge-shaped recesses on the second holder part 28. First holder part 27 and second holder part 28 are configured in FIG. 9 so that the aforesaid through-openings 21 are exclusively formed on the second holder part 28 or on the hot region 26.

Figure 10:
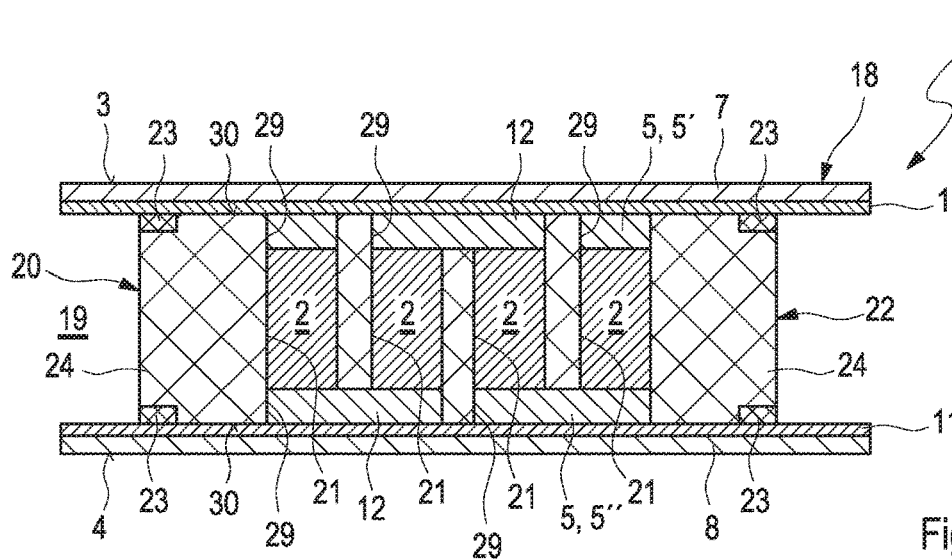

FIG. 10 shows a third sub-aspect of the second aspect of the present invention. Here the holder 20 for the conductor bridges 5' proximal to the hot-side substrate 7 and/or for the conductor bridges 5" proximal to the cold-side substrate 8 each have a recess 29 in which the conductor bridges 5 are arranged in a recessed manner. Shown here is a special embodiment in which the recesses 29 are dimensioned so that the conductor bridges 5 are arranged recessed so far therein that they each end flush with an outer side 30 of the holder 20 facing the respective substrate 7, 8. As a result, said outer side 30 rests flat on the respective substrate 7, 8.

Figure 11:
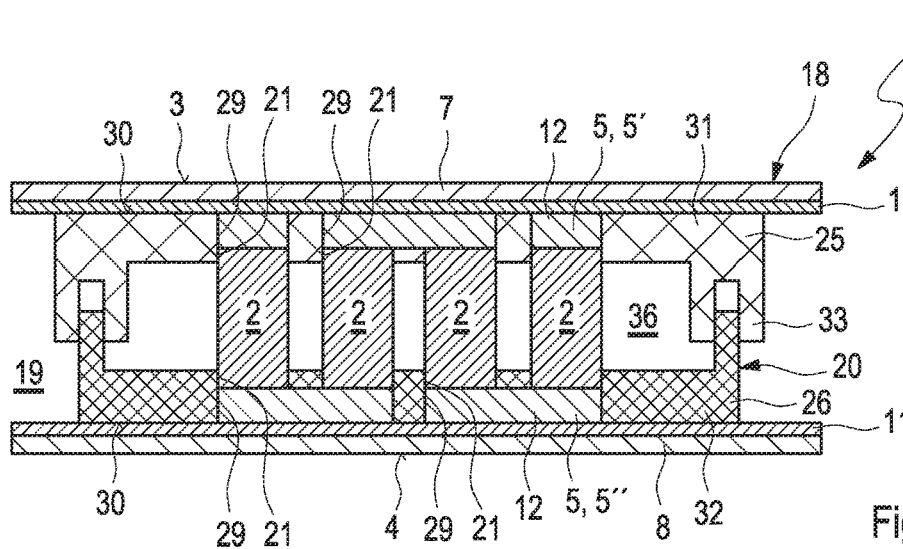
Figure 12:
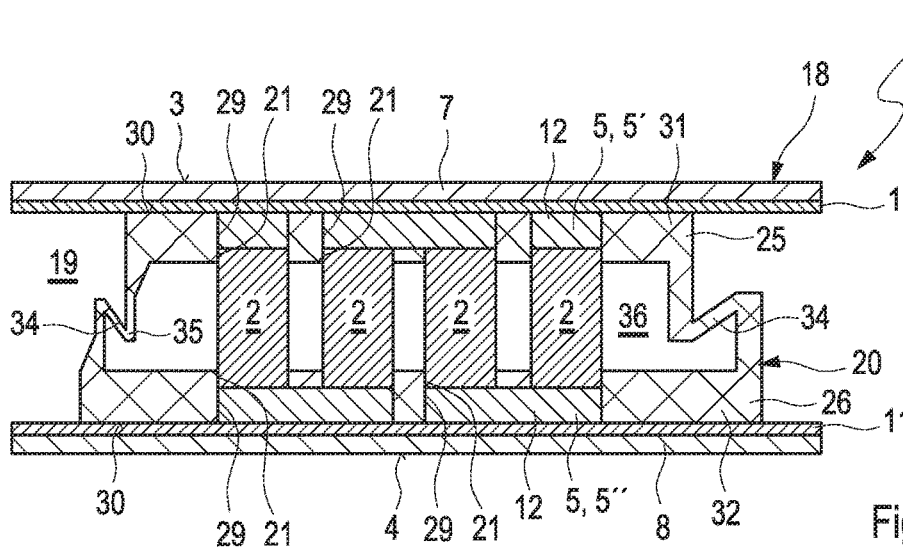

According to FIGS. 11 and 12 according to a fourth sub-aspect of the second aspect of the present invention, it can be provided that the holder 20 has a hot part 31 proximal to the hot-side substrate 7 and a cold part 32 proximal to the cold-side substrate 8. The aforesaid through openings 21 are formed both in the hot part 31 and in the cold part 32. Furthermore it is shown in FIGS. 11 and 12 that the recesses 29 explained with reference to FIG. 10 can also be formed in the hot part 31 and in the cold part 32.

An embodiment is advantageous in which the hot part 31 is fastened to the hot-side substrate 7 whilst the cold part 32 is adjustable relative to the hot part 31 along the thermoelectric elements 2. In other words, in this design the cold part 32 is not fastened to the cold-side substrate 8. In the converse design however the cold part 32 is fastened to the cold-side substrate 8 whilst the hot part 31 is not fastened to the hot-side substrate 7 but is arranged adjustably relative to the cold part 32 along the thermoelectric elements 2. FIG. 11 shows purely as an example a guide 33 which improves the adjustability of hot part 31 and cold part 32 relative to one another. FIG. 12 on the other hand shows a connection 34 between the hot part 31 and the cold part 32 which can be configured in an articulated and/or elastic manner and which in particular can have at least one predetermined breaking point 35. The articulated or elastic connection 34 can allow the desired relative movements. Likewise the predetermined breaking point 35 can break with sufficient force and then enable the desired relative adjustment.

As can be seen from FIGS. 11 and 12, an intermediate space 36 can additionally be formed in the region of the thermoelectric elements 2 between the hot part 31 and the cold part 32 in which hot part 31 and cold part 32 are spaced apart from one another. During a relative adjustment of the hot part 31 relative to the cold part 32, this distance is reduced.

In another embodiment, it can be provided that on the one hand the hot part 31 is firmly connected to the hot-side substrate 7 whilst on the other hand the cold part 32 is firmly connected to the cold-side substrate 8. Additionally or alternatively it can be provided that the hot part 31 corresponds to the aforesaid hot region 25 and accordingly is made of a first material whilst the cold part 32 corresponds to the cold region 26 and is made from the second material.

The examples in FIGS. 9 and 13 to 15 show another embodiment which corresponds to a fifth sub-aspect of the second aspect of the present invention. Accordingly, the holder 20 has a positioning region 37 in which the through-openings 21 are exclusively formed. This positioning region 37 is supported via at least one holding region 38 on at least one of the substrates 7, 8, preferably on both substrates 7, 8. It is noticeable in this embodiment that the positioning region 37 has a greater distance from the hot-side substrate 7 than from the cold-side substrate 8. Expediently the distance of the positioning region 37 from the hot-side substrate 7 is at least twice as large as that from the cold-side substrate 8. If only a common holding region 38 is provided, this can be configured as a frame which borders the region in which the thermoelectric elements 2 are arranged, in a closed manner in the circumferential direction. Alternatively a plurality of separate holding regions 38 can be provided, e.g. in the four corners, a rectangular module 1 which are also located outside the region of the thermoelectric element 2. The holding region or regions 38 thus extend in the aforementioned circumferential region 24.

Figure 13:
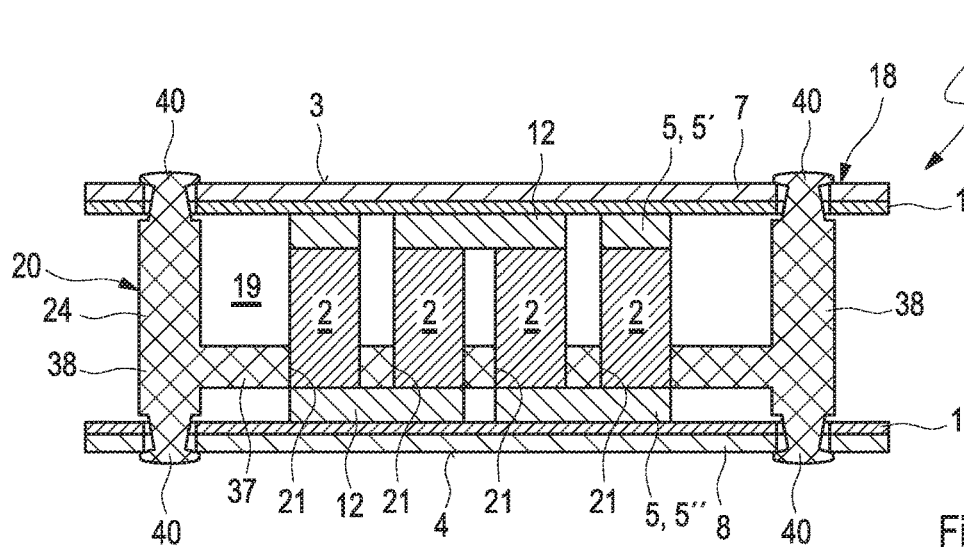
Figure 14:
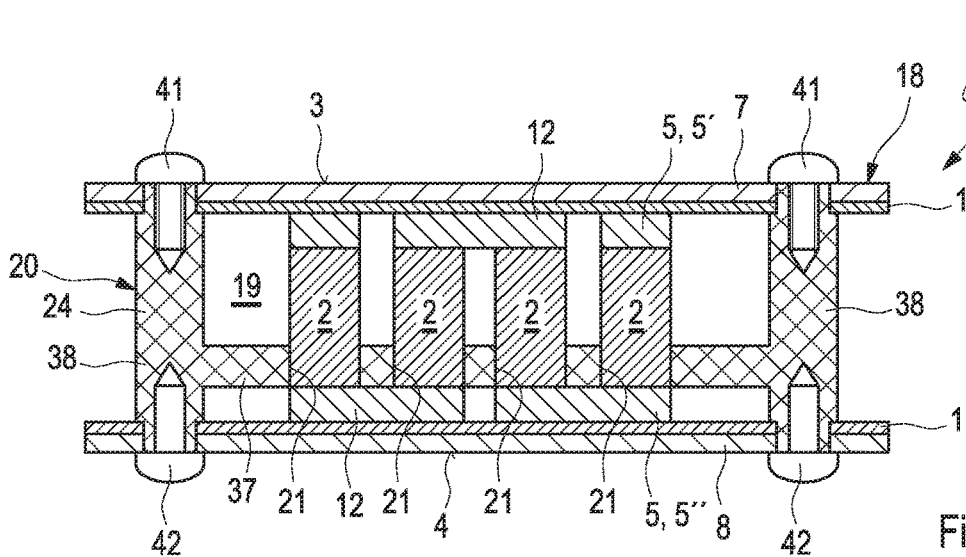
Figure 15:
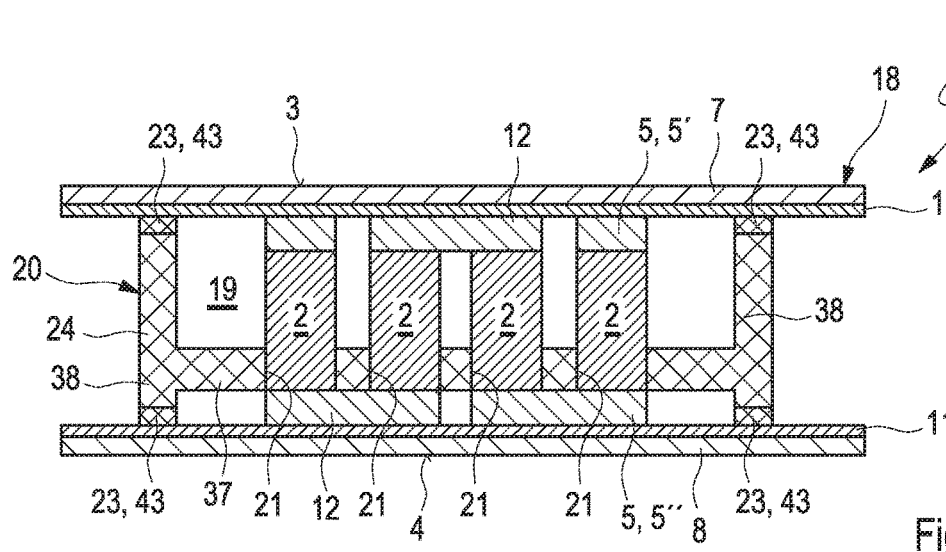

The holding region or regions 38 can be firmly connected to the respective substrate 7, 8 in various suitable manners. FIG. 9 shows plug connections 39 between the holding regions 38 and the hot-side substrate 7. FIG. 9 additionally shows clip connections 40 between the holding regions 38 and the cold-side substrate 8. FIG. 13 shows clip connections 40 between the holding regions 38 and the hot-side substrate 7 on the one hand and the cold-side substrate 8 on the other hand. FIG. 14 shows screw connections 41 between the holding regions 38 and the hot-side substrate 7 as well as pin connections 42 between the holding regions 38 and the cold-side substrate 8. FIG. 15 on the other hand shows adhesive connections 43 by means of which the holding regions 38 are fixed on the hot-side substrate 7 and on the cold-side substrate 8.

According to FIGS. 21 to 24, a sixth sub-aspect of the second aspect which can be implemented additionally or alternatively to the previously described sub-aspects, it can be provided that the conductor bridges 5 are each fixed by means of a holding element 68 on the holder 20. Combined with a loose contact between the conductor bridges 5 and the respective substrate 7, 8, a cohesive unit corresponding to the aforementioned block 22 can be formed from holder 20, thermoelectric elements 2 and conductor bridges 5, which is mounted as a whole in a floating manner relative to the respective substrate 7, 8. In the example, a plurality of, preferably all, the conductor bridges 5 are firmly connected to the holder 20 by means of such holding elements 68. These design is particularly advantageous if the conductor bridges 5 are also only in loose contact with the thermoelectric elements 2.

In the examples shown, the respective holding element 68 each has a holding element base 69 from which at least one holding element shaft 70 emanates, which passes through a conductor bridge opening 71 formed in the respective conductor bridge 5 and penetrates into the holder 20. The holding element base 69 is thereby supported on an outer side of the respective conductor bridge 5 facing away from the holder 20. This results in a particularly efficient positive fixing for the respective conductor bridge 5 on the holder 20.

According to the examples shown here, the respective conductor bridge 5 has a recess 72 on its outer side in which the holding element base 69 of the respective holding element 68 is arranged in a recessed manner. Thus, contact of the holding element 68 with the respective substrate 7, 8 can be avoided.

Figure 21:
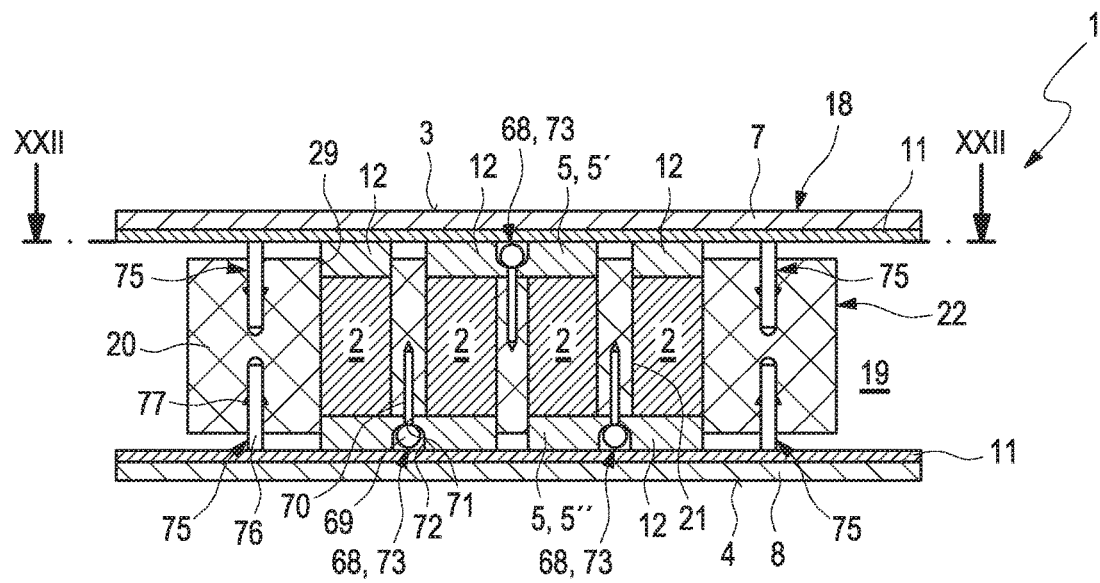
FIG. 21 shows a sectional view of the module as in FIGS. 1 to 19 but in a different embodiment.
Figure 22:
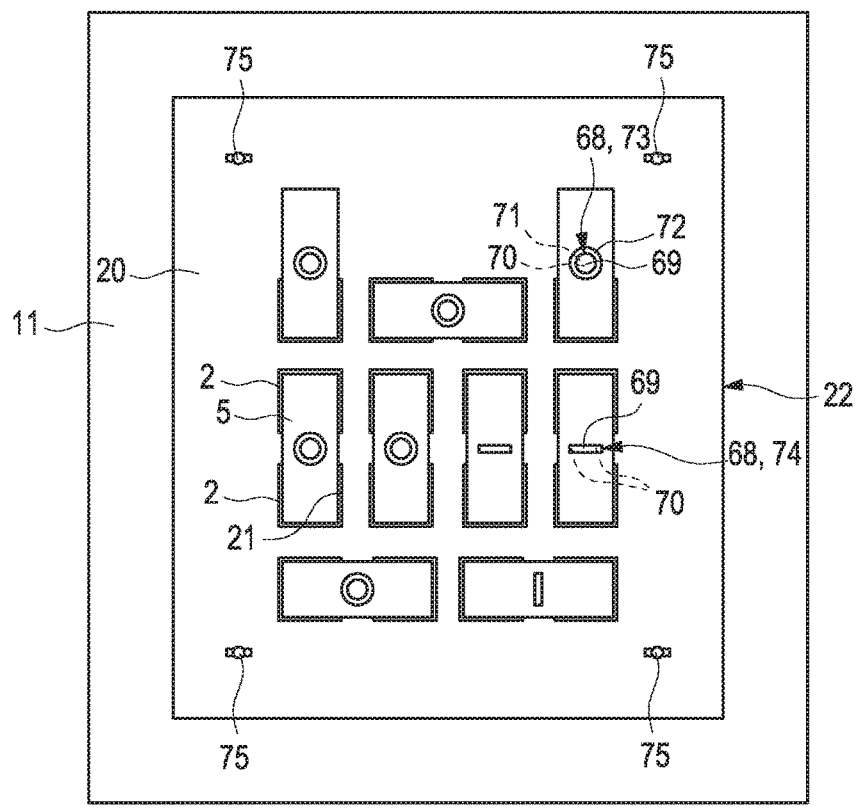
FIG. 22 shows a sectional view of the module from FIG. 21 according to the lines of intersection XXII.
Figure 23:
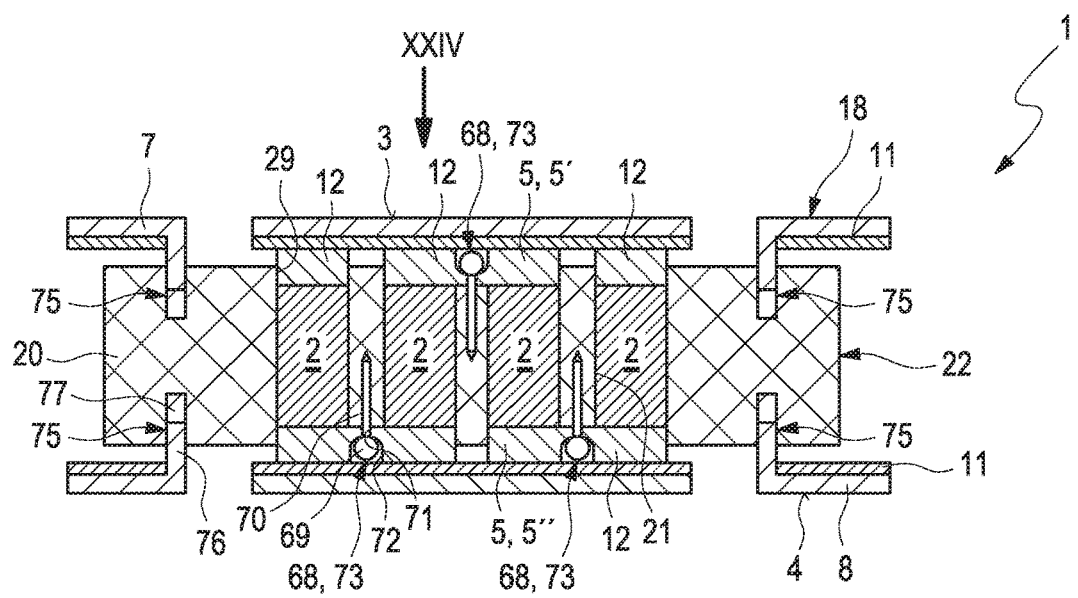
FIG. 23 shows a sectional view of the module as in FIGS. 1 to 19 and 21 but in a further embodiment.
Figure 24:
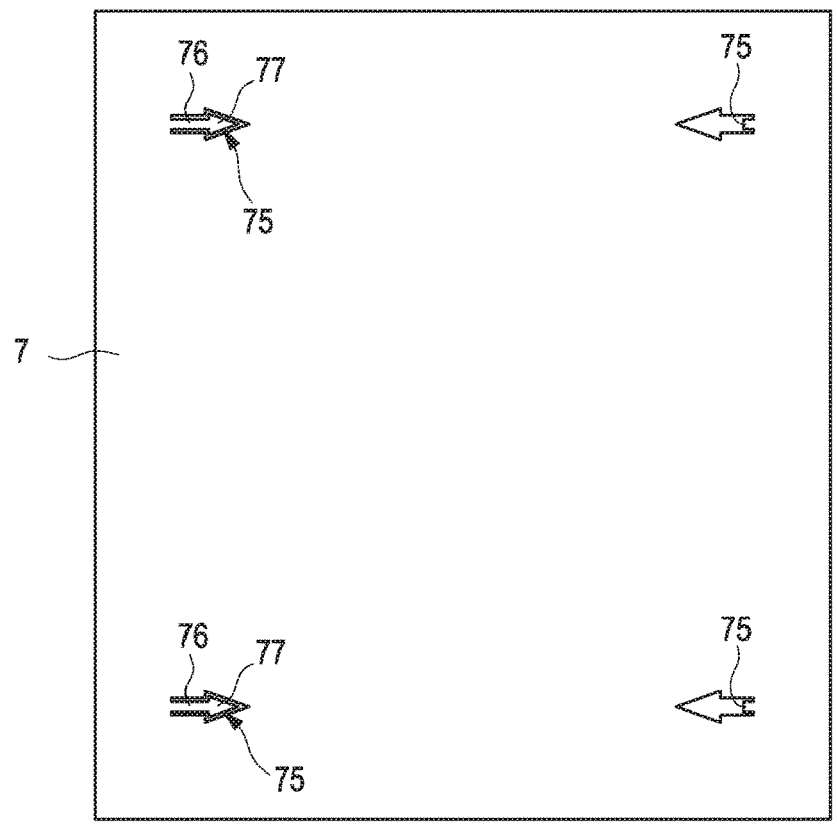
FIG. 24 shows a plan view of the module from FIG. 23 according to a viewing direction XXIV.

The holding elements 68 which can be identified in FIGS. 21 and 23 are each configured as nails 73. In the view in FIG. 22, a plurality of holding elements 68 are each configured as nails 73 whereas a plurality of other holding elements 68 are configured as staples 74 or as clips 74.

According to a seventh sub-aspect of the second aspect which can be implemented additionally or alternatively to the previously described sub-aspects, it is provided according to FIGS. 21 to 24 that at least one fixing element 75 is arranged fixedly on the hot-side substrate 7 and/or on the cold-side substrate 8 by means of which the holder 20 is fastened on the respective substrate 7, 8. By this means the holder can be fixed particularly easily on the respective substrate. By means of the holder 20 fixed on the respective substrate 7, 8, the said block 22 and therefore the thermoelectric elements 2 positioned therewith and optionally the conductor bridges 5 fixed thereon are then positioned relative to the respective substrate 7, 8.

In the examples it is provided that the respective fixing element 75 has a fixing mandrel 76 protruding from the respective substrate 7, 8 which penetrates into the holder 20. The respective fixing element 75 has at least one fixing barb 77 on its fixing mandrel 76 which is hooked or in engagement with the holder 20.

FIGS. 23 and 24 show an example in which the respective fixing element 75 is formed integrally on the substrate 7 or 8 and in which the respective fixing element 75 is cut freely and exposed on the respective substrate 7, 8 configured as metal sheet. In FIG. 24 the two fixing elements 75 shown on the left are only cut freely and not yet exposed whereas the two fixing elements 75 shown on the right are already exposed on the side facing away from the observer.

As already explained previously, FIGS. 1 and 16 to 19 show one of at least two electrical connections 6 of the module 1. In this case, according to FIG. 1 it is possible in principle to connect the electrical connection 6 directly to one of the conductor bridges 5, here the conductor bridge 5''' if the material of this conductor bridge 5''' is suitable for such a connection. Preferably soldered connections are used here.

Figure 16:
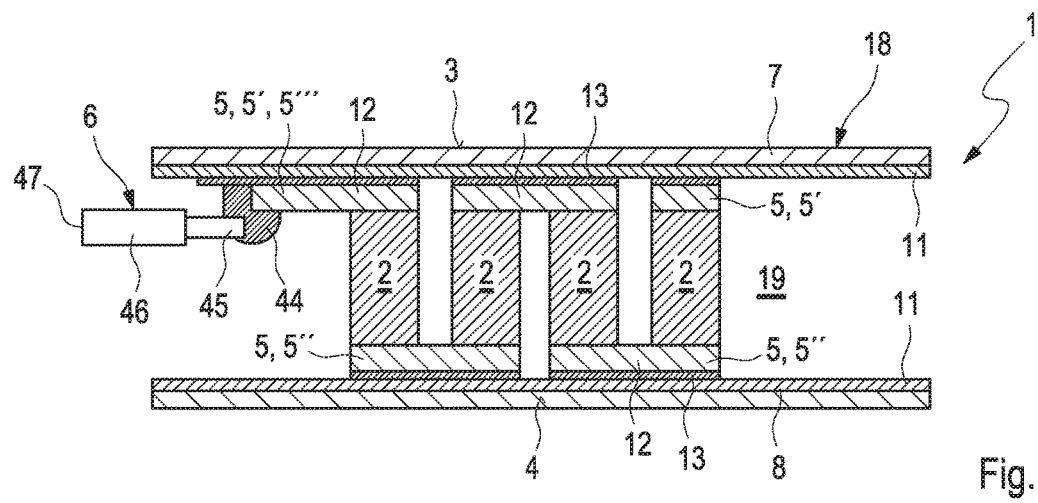
Figure 19:
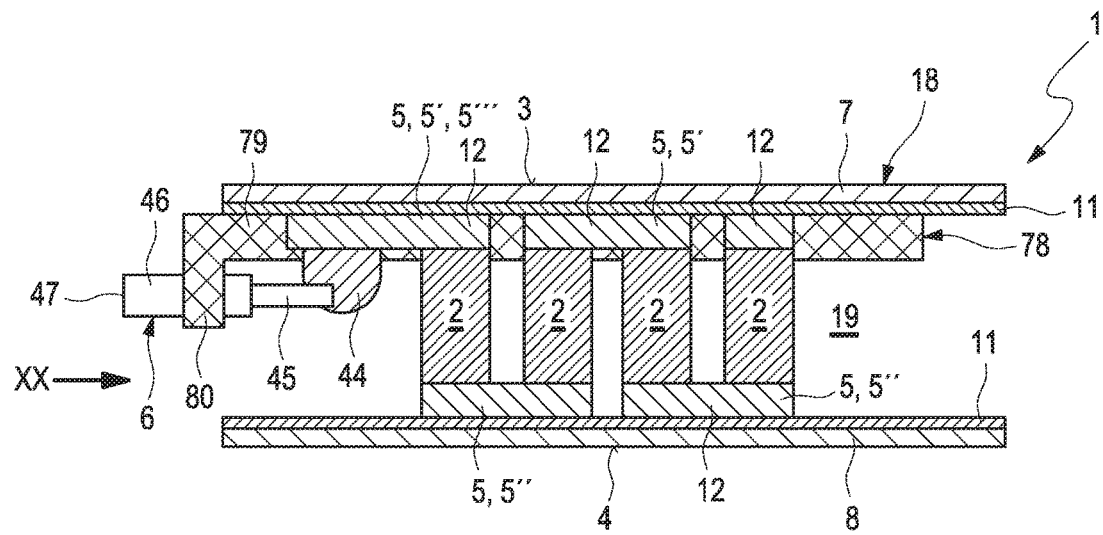
Figure 20:
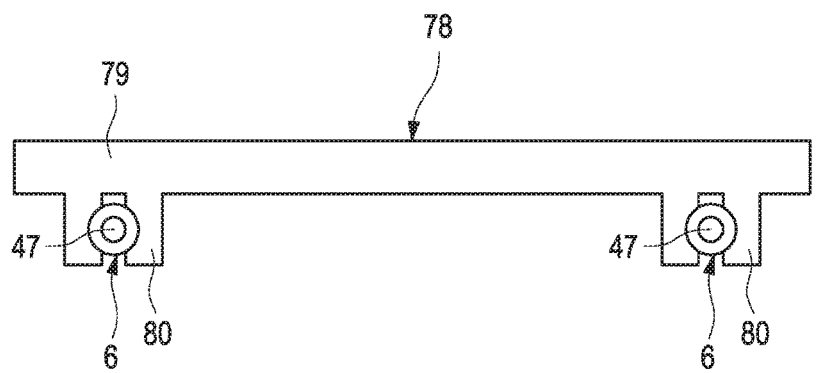
FIG. 20 shows a side view of a connecting region of the module from FIG. 19 according to a viewing direction XX.

The same applies to the embodiments shown in FIGS. 16 and 19 in which the connection is merely implemented with the aid of a large-volume solder spot 44 by means of which a contact element 45 of the connection 6 is connected in an electrically conducting and mechanically firm manner to the respective conductor bridge 5''' and/or to a metal coating 13 of the insulation 11. A connection element 46 is formed on the contact element 45 which defines a connection point 47 for connection of an electrical cable.

In the examples in FIGS. 19 and 20, a clamping web 79 is additionally provided which is arranged on one of the substrates 7, 8, here on the hot-side substrate 7. In the example, a plurality of clamping webs 79 are combined to form a clamping frame 78 which encloses the thermoelectric elements 2. The clamping frame 78 is therefore preferably formed from four webs 79 arranged at right angles. The single clamping web 79 or one of the clamping webs 79 extends in the area of the connections 6 laterally adjacent to the thermoelectric elements 2. This clamping web 39 has a clip 80 for at least one of the connections 6 which fixes the respective connecting element 46 by means of clamping force on the clamping web 78. This results in a secure fixing for the clamping element 46 which decouples mechanical loads which can act on the clamping element 46 via the said cable from the solder point 44. In addition, the solder point 44 can be produced more easily by machine if the connecting element 46 is already positioned with the clamping web 79 at the correct position.

Figure 17:
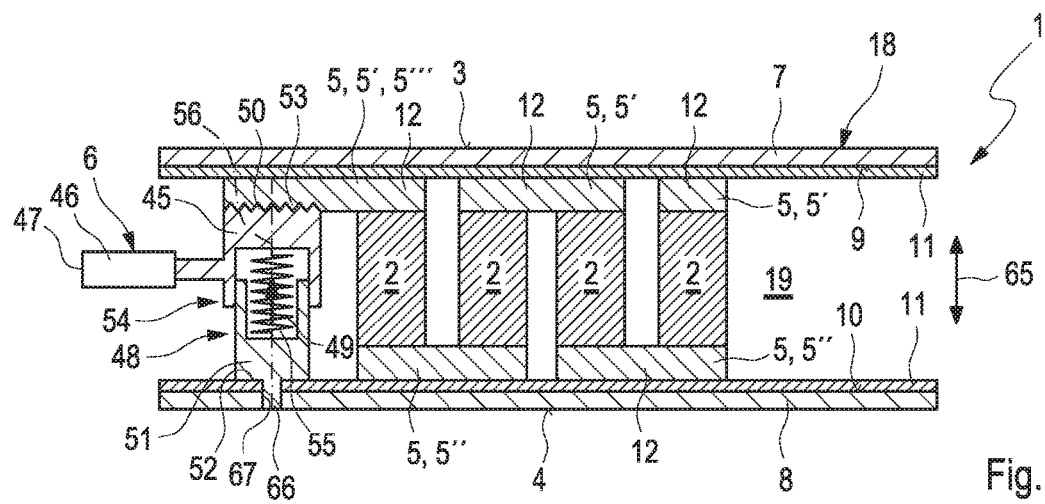
Figure 18:
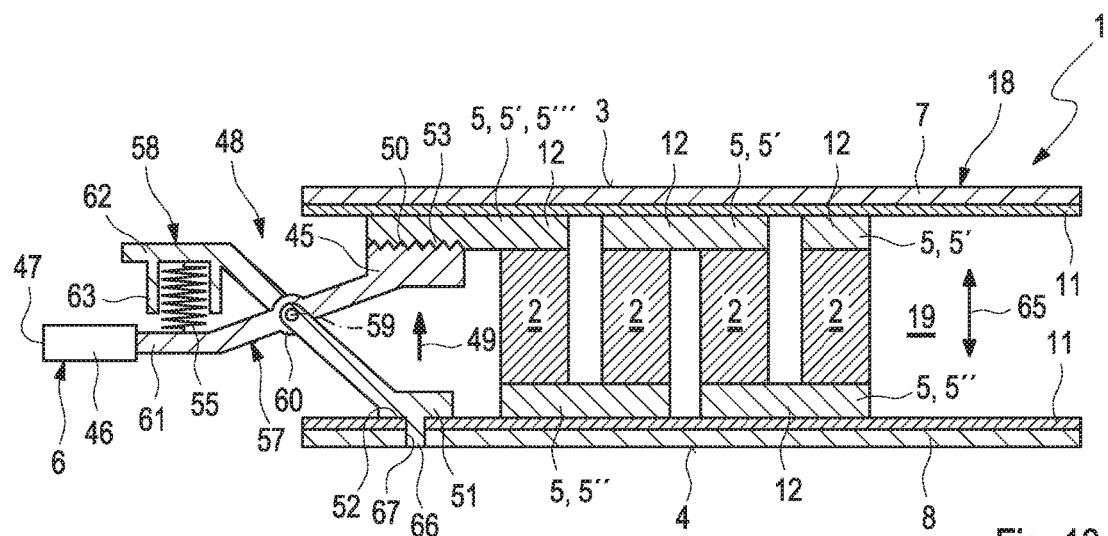

FIGS. 17 and 18 now show another embodiment for implementing such an electrical connection which shows a third aspect of the present invention. For this purpose the electrical connection 6 comprises a pre-tensioning device 48 which presses the contact element 45 against the respective conductor bridge 5''' by means of a pre-tensioning force 49. Accordingly, the contact element 45 now rests in a pre-tensioned manner on an inner side of the respective conductor bridge 5 facing the thermoelectric elements 2 which is here also designated by 5'''. In this case, the pre-tensioning force 49 is oriented parallel to the distance direction 65 of the substrates 7, 8.

In the examples of FIGS. 17 and 18, the contact element 45 is provided for this purpose with a contact contour 50 which has elevations which taper and accordingly enable a linear and/or punctuate contact with the conductor bridge 5. In the sectional views shown a sawtooth-shaped profile can be identified. Accordingly, the contact contour 50 has a plurality of parallel tapering webs and/or a plurality of tapering pyramids or cones. If a soft material is used here for the conductor bridge 5 or its bridge body 12, the contact contour 50 can penetrate into the surface of the conductor bridge 5 and thereby make a particularly intimate contact.

The pre-tensioning device 48 pre-tensions the contact element 45 in the direction of a substrate, here in the direction of the hot-side substrate 7 against the respective conductor bridge 5 and is thereby supported on the other substrate, here on the cold-side substrate 8. Furthermore, the pre-tensioning device 48 is supported parallel to the distance direction of the substrates 7, 8 in alignment with the contact element 45 on the cold-side substrate 8.

Expediently the pre-tensioning device 48 has a support element 51 which is supported on the cold-side substrate 8. The support element 51 is thereby supported in a support position 52 on the cold-side substrate 8. In contrast the contact element 45 is supported at a contact point 53 on the respective conductor bridge 5.

In the embodiment shown in FIG. 17 the support element 51 and the contact element 45 are guided longitudinally displaceably on one another. In particular, for this purpose a telescopic guide 54 is formed between the support element 51 and the contact element 45. This longitudinal guide or the telescopic guide 54 is thereby oriented parallel to the pre-tensioning force 49, which for its part extends parallel to the distance direction 65 of the two substrates 7, 8.

In both embodiments the pre-tensioning device 48 has a spring element 55 which is compressed to produce the pre-tensioning force 49. This therefore comprises a compression spring.

In the example of FIG. 17, the spring element 45 is positioned so that it is supported on the one hand on the support element 51 and on the other hand on the contact element 45. Furthermore, the spring element 55 is here aligned centrally to an imaginary connecting line 56 which leads directly from the contact point 53 to the support point 52. This connecting line 56 here extends parallel to a distance direction 65 of the substrates 7, 8 in which the substrates 7, 8 are spaced apart from one another. In particular, the spring element 55 is here arranged inside the telescopic guide 54.

In the example in FIG. 18 the pre-tensioning device 48 has a contact lever 57 which has the contact element 45 and a support lever 58 on which the support element 51 is formed. Contact lever 57 and support lever 58 are mounted pivotably on one another about a pivot axis 59. A corresponding bearing 59 is here designated by 60. The pivot axis 59 extends perpendicular to the distance direction 65 of the substrates 7, 8 and in FIG. 18 is perpendicular to the plane of the drawing. The spring element 55 is supported on a side of the pivot axis 59 facing away from the contact element 45 and from the support element 51 on the contact lever 57 and on the support lever 58 and specifically in a compressed state in order to produce the pre-tension 49. The connection point 47 is here arranged at an end 61 of the connection lever 57 remote the from the connection element 45. A guide 63 for the spring element 55 is formed on the support lever 58 at an end remote from the support element 52.

In the embodiments shown in FIGS. 17 and 18, the support element 51 additionally has a pin 66 which protrudes on a side of the support element 51 facing away from the hot-side substrate 7 and engages in a pin receptacle 67 formed on the cold-side substrate 8. Whereas the contact element 45 and the optionally provided contact lever 57 consist of an electrically conducting material, preferably of metal, the support element 51 and the optionally provided support lever 58 can consist of an electrically insulating material, preferably of a plastic.

The invention claimed is:

1. A thermoelectric module, comprising:
   a plurality of thermoelectric elements arranged spaced apart from one another between a hot side and a cold side;
   a plurality of conductor bridges electrically interconnecting the plurality of thermoelectric elements;
   a hot-side substrate defining the hot side;
   a cold-side substrate defining the cold side;
   an electrically insulated holder for positioning the plurality of thermoelectric elements between the hot-side substrate and the cold-side substrate, the holder including a separate through-opening for each of the plurality of thermoelectric elements;

wherein at least one of the plurality of conductor bridges that are proximal to the hot-side substrate rest loosely on the hot-side substrate and the plurality of conductor bridges that are proximal to the cold-side substrate rest loosely on the cold-side substrate; and wherein at least one conductor bridge of the plurality of conductor bridges is secured via a holding element on the holder.

2. The module according to claim 1, wherein the holding element includes a holding element base and at least one holding element shaft emanating from the holding element base, the at least one holding element shaft passing through a conductor bridge opening disposed in the at least one conductor bridge and penetrates into the holder, wherein the holding element base is supported on an outer side of the at least one conductor bridge facing away from the holder.

3. The module according to claim 2, wherein the at least one conductor bridge has a recess on an outer side and the holding element base of the holding element is arranged in a recessed manner in the recess.

4. The module according to claim 2, wherein the holding element includes at least one of a nail, a staple, and a clip.

5. The module according to claim 1, further comprising at least one fixing element arranged fixedly on at least one of the hot-side substrate and the cold-side substrate, wherein the holder is fastened via the at least one fixing element on the at least one of the hot-side substrate and the cold-side substrate.

6. The module according to claim 1, wherein the holder is secured only in a circumferential region bordering the plurality of thermoelectric elements in a circumferential direction on at least one of the hot-side substrate and the cold-side substrate.

7. A thermoelectric module, comprising:
a plurality of thermoelectric elements arranged spaced apart from one another between a hot side and a cold side;
a plurality of conductor bridges electrically interconnecting the plurality of thermoelectric elements;
a hot-side substrate defining the hot side;
a cold-side substrate defining the cold side;
an electrically insulated holder for positioning the plurality of thermoelectric elements between the hot-side substrate and the cold-side substrate, the holder including a separate through-opening for each of the plurality of thermoelectric elements;
at least one fixing element arranged fixedly on at least one of the hot-side substrate and the cold-side substrate, wherein the holder is fastened via the at least one fixing element on the hot-side substrate and the cold-side substrate; and
wherein at least one of the plurality of conductor bridges that are proximal to the hot-side substrate rest loosely on the hot-side substrate and the plurality of conductor bridges that are proximal to the cold-side substrate rest loosely on the cold-side substrate.

8. The module according to claim 7, wherein the at least one fixing element includes a fixing mandrel projecting from the at least one of the hot-side substrate and the cold-side substrate, and wherein the fixing mandrel penetrates into the holder.

9. The module according to claim 8, wherein the at least one fixing element further includes at least one fixing barb disposed on the fixing mandrel, the at least one fixing barb engaging with the holder.

10. The module according to claim 7, wherein at least one of:
the at least one fixing element is disposed integrally on the at least one of the hot-side substrate and the cold-side substrate; and
the at least one fixing element is cut freely and exposed on the at least one of the hot-side substrate and the cold-side substrate configured as metal sheet.

11. A thermoelectric module, comprising:
a plurality of thermoelectric elements arranged spaced apart from one another between a hot side and a cold side;
a plurality of conductor bridges electrically interconnecting the plurality of thermoelectric elements;
a hot-side substrate defining the hot side;
a cold-side substrate defining the cold side;
an electrically insulated holder for positioning the plurality of thermoelectric elements between the hot-side substrate and the cold-side substrate, the holder including a separate through-opening for each of the plurality of thermoelectric elements;
wherein at least one of the plurality of conductor bridges that are proximal to the hot-side substrate rest loosely on the hot-side substrate and the plurality of conductor bridges that are proximal to the cold-side substrate rest loosely on the cold-side substrate; and
wherein one of:
the hot-side substrate and the cold-side substrate are part of a housing enclosing a hermetically closed interior and the plurality of thermoelectric elements are arranged in the hermetically closed interior; and
at least one of the hot-side substrate is part of a wall of a heating channel for guiding a heating fluid and the cold-side substrate is part of a wall of a cooling channel for guiding a cooling fluid.

12. The module according to claim 11, wherein the holder has a hot region facing the hot-side substrate composed of a first material and a cold region facing the cold-side substrate composed of a second material that is different from the first material.

13. The module according to claim 12, wherein the first material of the hot region includes ceramic and the second material the cold region includes plastic.

14. The module according to claim 12, wherein the hot region includes at least one first holder part and the cold region includes at least one second holder part, and wherein the at least one first holder part and the at least one second holder part are attached to one another.

15. The module according to claim 12, wherein the separate through-opening of the holder for each of the plurality of thermoelectric elements is disposed only on one of the hot region and the cold region.

16. The module according to claim 11, wherein the holder includes a hot part proximal to the hot-side substrate and a cold part proximal to the cold-side substrate, and wherein the separate through-opening for each of the plurality of thermoelectric elements is disposed in the hot part and in the cold part.

17. The module according to claim 16, wherein one of:
the hot part is secured on the hot-side substrate and the cold part is adjustable relative to the hot part along the plurality of thermoelectric elements; and the cold part is secured on the cold-side substrate and the hot part is adjustable relative to the cold part along the plurality of thermoelectric elements.

18. The module according to claim 16, wherein one of:

the hot part and the cold part are arranged adjustable on one another via a guide; and the hot part and the cold part are secured to one another via a connection, the connection configured at least one of articulated, elastic, and provided with a predetermined breaking point to permit relative adjustments between the hot part and the cold part.

19. The module according to claim 16, wherein an intermediate space is disposed in an area of the plurality of thermoelectric elements between the hot part and the cold part, and wherein the hot part and the cold part are spaced apart from one another in the intermediate space.

20. The module according claim 11, wherein the holder defines a positioning region having the separate through-opening for each of the plurality of thermoelectric elements, the positioning region supported via at least one holding region on at least one of the hot-side substrate and the cold-side substrate; and wherein the positioning region has a greater distance from the hot-side substrate than from the cold-side substrate.

21. The module according to claim 20, wherein the at least one holding region is at least one of clipped, screwed, pinned, and adhesively bonded to the at least one of the hot-side substrate and the cold-side substrate.

22. A thermoelectric module, comprising:

a plurality of thermoelectric elements arranged spaced apart from one another between a hot side and a cold side;

a plurality of conductor bridges electrically interconnecting the plurality of thermoelectric elements;

a hot-side substrate defining the hot side;

a cold-side substrate defining the cold side;

an electrically insulated holder for positioning the plurality of thermoelectric elements between the hot-side substrate and the cold-side substrate, the holder including a separate through-opening for each of the plurality of thermoelectric elements;

wherein at least one of the plurality of conductor bridges that are proximal to the hot-side substrate rest loosely on the hot-side substrate and the plurality of conductor bridges that are proximal to the cold-side substrate rest loosely on the cold-side substrate; and wherein the holder has a plurality of recesses that receive at least one of the plurality of conductor bridges that are proximal to the hot-side substrate and the plurality of conductor bridges that are proximal to the cold-side substrate in a recessed manner.

23. The module according to claim 22, wherein the at least one of the plurality of conductor bridges that are proximal to the hot-side substrate and the plurality of conductor bridges that are proximal to the cold-side substrate are arranged recessed in the plurality of recesses to such an extent that the plurality of conductor bridges end flush with an outer side of the holder facing the at least one of the hot-side substrate and the cold-side substrate.

\* \* \* \* \*